(12) United States Patent
Nurser

(10) Patent No.: US 6,584,577 B1
(45) Date of Patent: Jun. 24, 2003

(54) SYSTEM FOR MEASURING RESPONSE TIME OF A CIRCUIT BY DETERMINING THE TIME DIFFERENCE BETWEEN THE EARLIER AND THE LATER CLOCK PULSES APPLIED TO THE CIRCUIT

(75) Inventor: Henry Nurser, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/546,809

(22) Filed: Apr. 11, 2000

(30) Foreign Application Priority Data

May 11, 1999 (GB) .............................. 9910942

(51) Int. Cl.[7] .............................. G08F 1/14; G11C 7/00; G11C 29/00
(52) U.S. Cl. .................... 713/502; 713/600; 710/58; 711/167; 714/719; 714/824; 365/201
(58) Field of Search ................... 713/401, 500, 713/502, 503, 600; 710/58, 60; 711/105, 167, 170; 714/718, 719, 724, 819, 824; 365/191, 194, 201, 233

(56) References Cited

U.S. PATENT DOCUMENTS

| | | | | |
|---|---|---|---|---|
| 4,736,351 A | * | 4/1988 | Oliver | 368/118 |
| 5,537,663 A | * | 7/1996 | Belmont et al. | 710/17 |
| 5,675,265 A | * | 10/1997 | Yamamori | 327/3 |
| 5,751,727 A | * | 5/1998 | Martens | 714/718 |
| 5,809,227 A | * | 9/1998 | Basile | 714/47 |
| 5,821,760 A | * | 10/1998 | Koeman et al. | 324/628 |
| 5,825,712 A | | 10/1998 | Higashi et al. | 365/230.03 |
| 5,875,135 A | | 2/1999 | Patwardhan et al. | 365/194 |
| 6,154,821 A | * | 11/2000 | Barth et al. | 711/170 |
| 6,185,637 B1 | * | 2/2001 | Strongin et al. | 710/35 |

FOREIGN PATENT DOCUMENTS

| | | | | |
|---|---|---|---|---|
| EP | 0 867 887 | | 9/1998 | G11C/29/00 |
| EP | 0 898 284 | | 2/1999 | G11C/29/00 |
| JP | 02184048 A | * | 7/1990 | H01L/21/82 |

OTHER PUBLICATIONS

European Standard Search Report from GB 0010942, filed May 11, 1999.

* cited by examiner

Primary Examiner—Thomas Lee
Assistant Examiner—Thuan Du
(74) Attorney, Agent, or Firm—Wolf, Greenfield & Sacks, P.C.

(57) ABSTRACT

A method and device for measuring the response time of a circuit are described in which clocking pulses are applied to the circuit at input pads, the input pads being connected to the circuit by circuitry having substantially the same delays. By adjusting the timing of the later clock pulse relative to the earlier clock pulse until a valid output is just achieved, the response time of the circuit can be measured using a register circuit.

14 Claims, 5 Drawing Sheets

US 6,584,577 B1

SYSTEM FOR MEASURING RESPONSE TIME OF A CIRCUIT BY DETERMINING THE TIME DIFFERENCE BETWEEN THE EARLIER AND THE LATER CLOCK PULSES APPLIED TO THE CIRCUIT

FIELD OF THE INVENTION

The present invention relates to a device for measuring the response time of a circuit and to a method of measuring the response time of a circuit.

More particularly, but not exclusively the invention relates to a method of determining the response time of a deeply embedded memory, for example a static RAM and to a device for determining the response time of a deeply embedded memory, for example a static RAM.

BACKGROUND OF THE INVENTION

Current techniques for evaluating embedded fast SRAM designs use either extremely high performance testing devices, which are costly or alternatively require physical access to internal nodes. The latter tends to be inaccurate and is not capable of providing statistical sampling over long periods of time.

It will be desirable to provide a method and device capable of providing statistical data on a number of circuits and to use conventional test apparatus to collect statistically significant data.

SUMMARY OF THE INVENTION

According to a first aspect of the present invention there is provided a device for measuring the response time of a circuit, the circuit having an output for providing a response to a stimulus at an input node thereof, the device comprising first circuitry having a clock node and an output, said first circuitry being connected to store an output condition, said output condition corresponding to a state of said circuit output at the time of occurrence of a clock pulse at said clock node, the device further comprising second circuitry and third circuitry, said second circuitry being responsive to a second circuitry input signal at its input to provide said stimulus at said input node of said circuit, and said third circuitry being responsive to a third circuitry input signal at its input to provide a clock pulse at said clock node whereby said response time is determined by the time between said second circuitry input signal and said third circuitry input signal, wherein said second circuitry has an output connected to said input node, and said third circuitry has an output connected to said clock node, and a delay between the input to said second circuitry and its output is substantially the same as a delay between the input and output of the third circuitry.

Preferably, said circuit comprises a memory, having address latch circuitry with a clock input as said circuit input node, an array of memory cells coupled to said address latch circuitry and sense amplifier circuitry connected to said array, said sense amplifier circuitry having a sense amplifier output as said circuit output.

Advantageously said memory is an embedded memory.

Advantageously said embedded memory comprises a SRAM.

Advantageously the first circuitry comprises flip-flop circuitry.

According to a second aspect of the present invention there is provided a device for measuring a response time of a circuit between an input node and a circuit output thereof, wherein said circuit output is connected via first connecting circuitry to an output pad, said device comprising a first timing signal source for providing a first timing signal to said input node via a first path having a first delay, clocked circuitry having a clock node and being connected at said circuit output, said clocked circuitry having an output to said first connecting circuitry, said clocked circuitry being responsive to a clock signal at said clock node to provide to said first connecting circuitry a signal existing at said circuit output immediately prior to the occurrence of said clock signal, the device further comprising a second timing signal source for providing a second timing signal as said clock signal to said clock node via a second path having a second delay substantially equal to said first delay, and means for determining a time period between said first and second timing signals.

Advantageously said clocked circuitry comprises a flip-flop.

Preferably the device further comprises a sensing device connected to said output pad for sensing a desired output thereat.

Preferably again said circuit comprises a static RAM.

Conveniently said static RAM comprises address latch circuitry having a latch clock node as said input node, an array of memory cells coupled to said address latch circuitry, and sense amplifier circuitry having a sense amplifier output node as said output node.

According to a further aspect of the present invention there is provided a method of measuring the response time of a circuit having a circuit output for providing an output in response to a stimulus applied to a circuit input, the circuit input being connected to a first input pad via first circuitry having a predetermined delay, the method comprising:

providing second circuitry having a clock node, said clock node being connected to a second input pad via third circuitry, said third circuitry having said predetermined delay, and said second circuitry having an output for storing an output condition, said output condition corresponding to the state of said circuit output at the time of occurrence of a clock pulse at said clock node;

repeatedly applying a stimulus to said first input pad and at a variable delay after each application, providing a clock pulse to said second input pad; and determining, as said response time, a value of said variable delay corresponding to a desired output condition of said second circuitry.

Preferably said second circuitry is coupled to an output pad, and said determining step comprises monitoring said output pad.

Advantageously said desired output condition is a valid condition such that reduction of said variable delay produces an invalid condition.

BRIEF DESCRIPTION OF THE DRAWINGS

Embodiments of the invention will now be described, by way of example only, with reference to the accompanying drawings in which.

DESCRIPTION OF THE PREFERRED EMBODIMENTS

Figure 1:
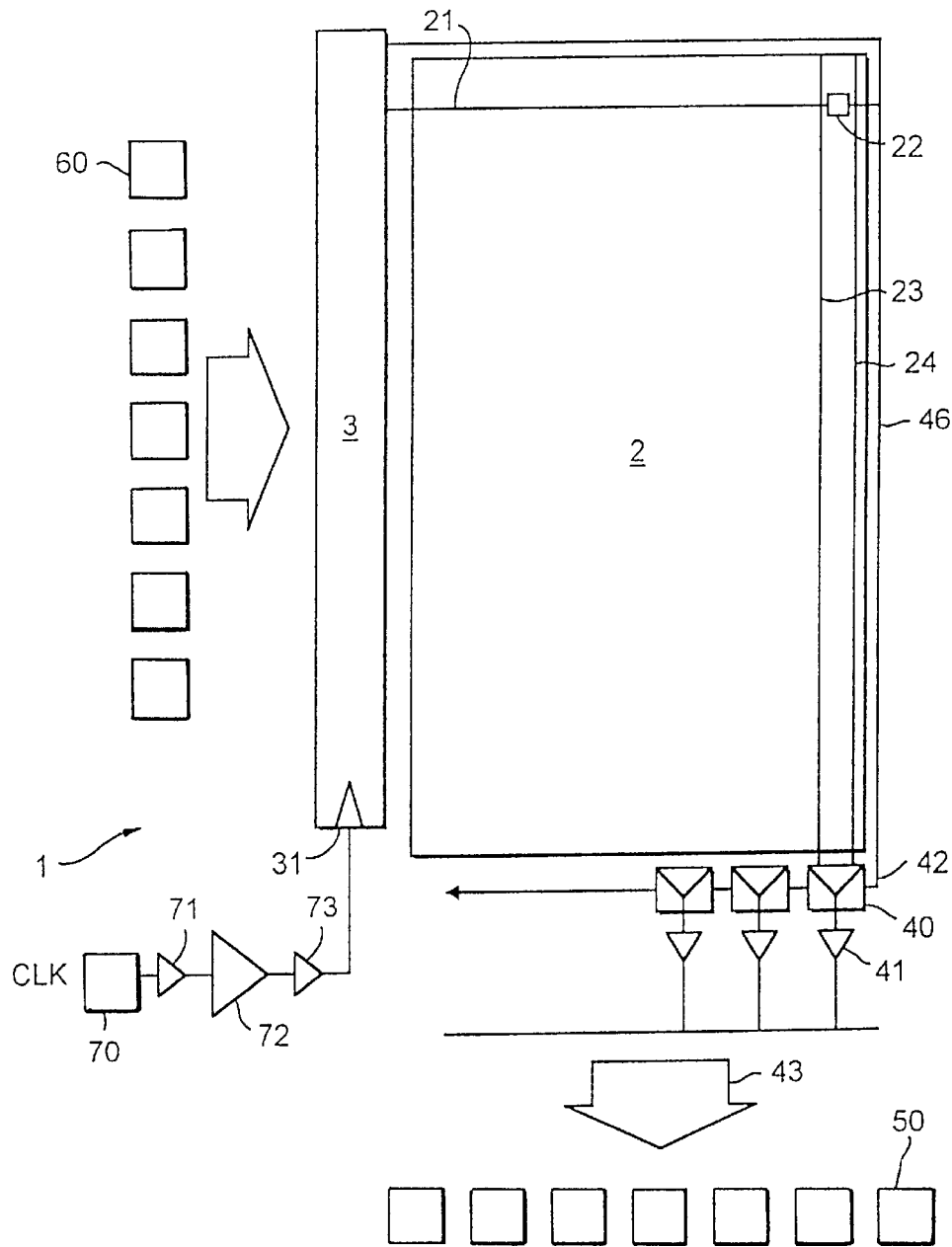
FIG. 1 shows a block schematic diagram of a conventional SRAM test chip.

In the various figures, like reference numerals refer to like parts.

Referring first to FIG. 1 a SRAM test chip 1 consists of a matrix memory array 2 which has an address register 3 connected to its plural wordlines 21, of which only one is shown. The wordlines 21 connect to a regular array of memory cells 22, of which again only one is shown.

Figure 2:
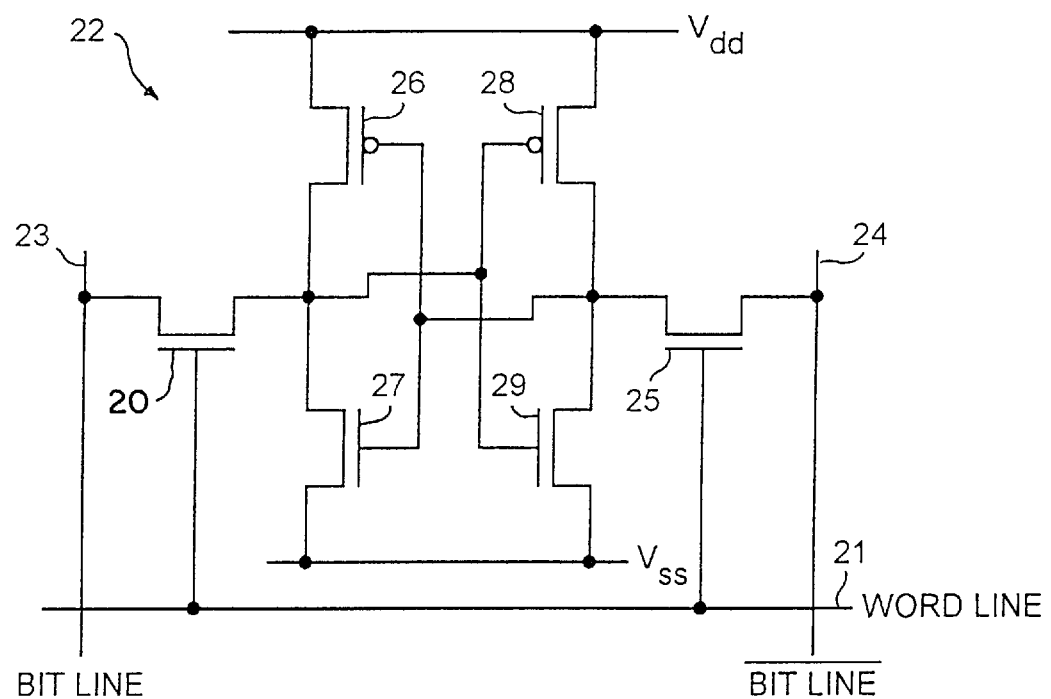
FIG. 2 shows an exemplary SRAM cell.

Referring now to FIG. 2, an exemplary memory cell 22 consists of two cross-coupled inverter circuits 26, 27; 28, 29. The left hand inverter as shown consists of a P channel FET 26 connected between a positive supply VDD and a first common node and an N channel FET 27 connected between the first common node and a negative supply VSS. The right hand inverter, as shown, similarly consists of a second P conductivity FET 28 connected between the positive supply VDD and a second common node, and a second N channel FET 29 connected between the second common node and the negative supply VSS. The gates of the first P and first N transistors 26, 27 are connected together and to the second common node, and the gates of the second P transistor 28 and the second N transistor 29 are connected together and to the first common node. The first common node is connected via an N type pass transistor 20 to a first bitline 23 and the second common node is connected via a second N channel pass transistor 25 to a second bitline 24. The wordline 21 forms the gate connection to both the first and second pass transistors 20 and 25. As is known to those skilled in the art the bitlines 23, 24 are complementary and form the column lines of the memory array whereas the wordlines form the row lines of the array.

In operation, information is written into the memory cell 22 by providing a differential potential on the bitlines 23, 24. If for example bitline 23 is connected to a logic 1 and bitline 24 to a logic 0, then when the wordline 21 goes logic 1 the pass transistors 20, 25 will turn on and the cross-coupled inverters will latch into a corresponding state with the first common node at a high potential and the second common node at a low potential. To read from the memory the wordline is once again connected to a logic 1 and the pass transistors 20, 25 will then turn on causing the bitline potential to tend towards the respective potential of the common node to which it is connected.

Returning again to FIG. 1, each pair of bitlines is connected to a respective sense amplifier 40. The outputs of the sense amplifiers 40 feed via buffers 41 to a corresponding number of output pads 50.

In the illustrated memory, 32 pairs of bitlines are provided and thus there are 32 sense amplifiers 40, connected to 32 output terminals 50 via output circuitry 43.

An input to the address register 3 is provided from a plurality of input pads 60 and the address register itself is clocked at an address register clock input 31. An address register clock input pad 70 is connected to the address register clock input 31 via a circuit path containing the three series elements 71, 72, 73 which figuratively illustrate the delay entailed. The sense amplifiers 40 are also clocked, each having a clock terminal 42. A clock pulse line 46 is connected between the address register 3 and the sense amplifier clock terminal 42, and has a delay sufficient to ensure that the sense amplifier 40 will operate correctly, as later described herein.

Figure 3:
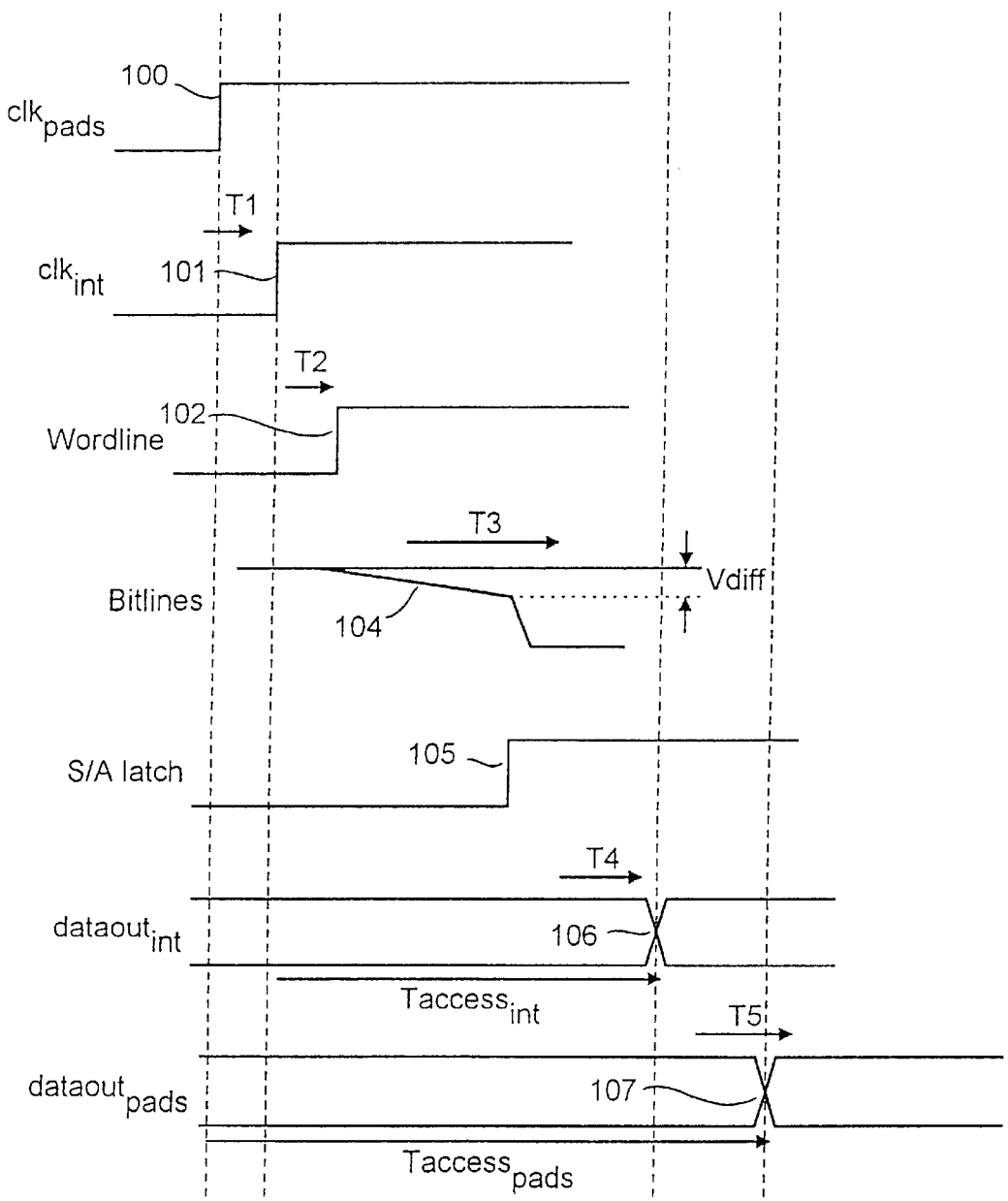
FIG. 3 shows a timing diagram for the circuit of FIG. 1.

Referring now to FIG. 3, in operation, a clock signal 100 is provided at address register clock input pad 70. After passing through the series elements 71–73, the clock pulse becomes an internal clock pulse 101 at a time T1 after the instant of application of the clock pulse 100 at the pad 70. The time period T1 is the delay induced by the path comprising series elements 71–73.

The action of the internal clock 101 on the address register 3 causes the register to apply a transition 102 to the wordlines 21 after a further time delay T2. This time delay T2 is predominantly due to the switching time of the address register 3.

As previously discussed, the transition 102 on the wordlines 21 causes the memory cells 22 to become connected to the complementary bitlines 23, 24. The bitlines 23, 24 have a relatively high capacitance and the memory cells 22 have a relatively low current driving capability which means that the change of potential of 104 is relatively slow. If the sense amplifier 40 were activated before the differential between the complementary bitlines had achieved a sufficiently high value, the sense amplifier might latch into an incorrect state. Accordingly, a clock pulse 105 is applied to the clock input 42 of the sense amplifiers 40 at a time T3 where it is expected that the bitlines will have a sufficiently high differential voltage to ensure correct sensing. In turn, the sense amplifiers require a further interval T4 before the outputs at the output nodes of the buffers 41 have achieved a reliable level 106. Finally, the data output circuitry 43 causes a yet further delay T5 (107) before the response to the access caused by the clock pulse 100 applied to terminal 70 is accessible at the output pads 50.

The access time of the memory array 2 is defined as the period between the application of the clock pulse 101 at clock node 31 to the appearance of the data output at the buffer 41 output node. Where the memory 2 is embedded, access is normally available only to the input pads 60, 70 and the output pads 50. Measurements taken at these points will give a false access time measurement due to the inability to eliminate the time T1 and the final delay T5. This is especially serious where the memory 2 is a highly embedded memory due to the path length between the memory and the terminals.

Figure 4:
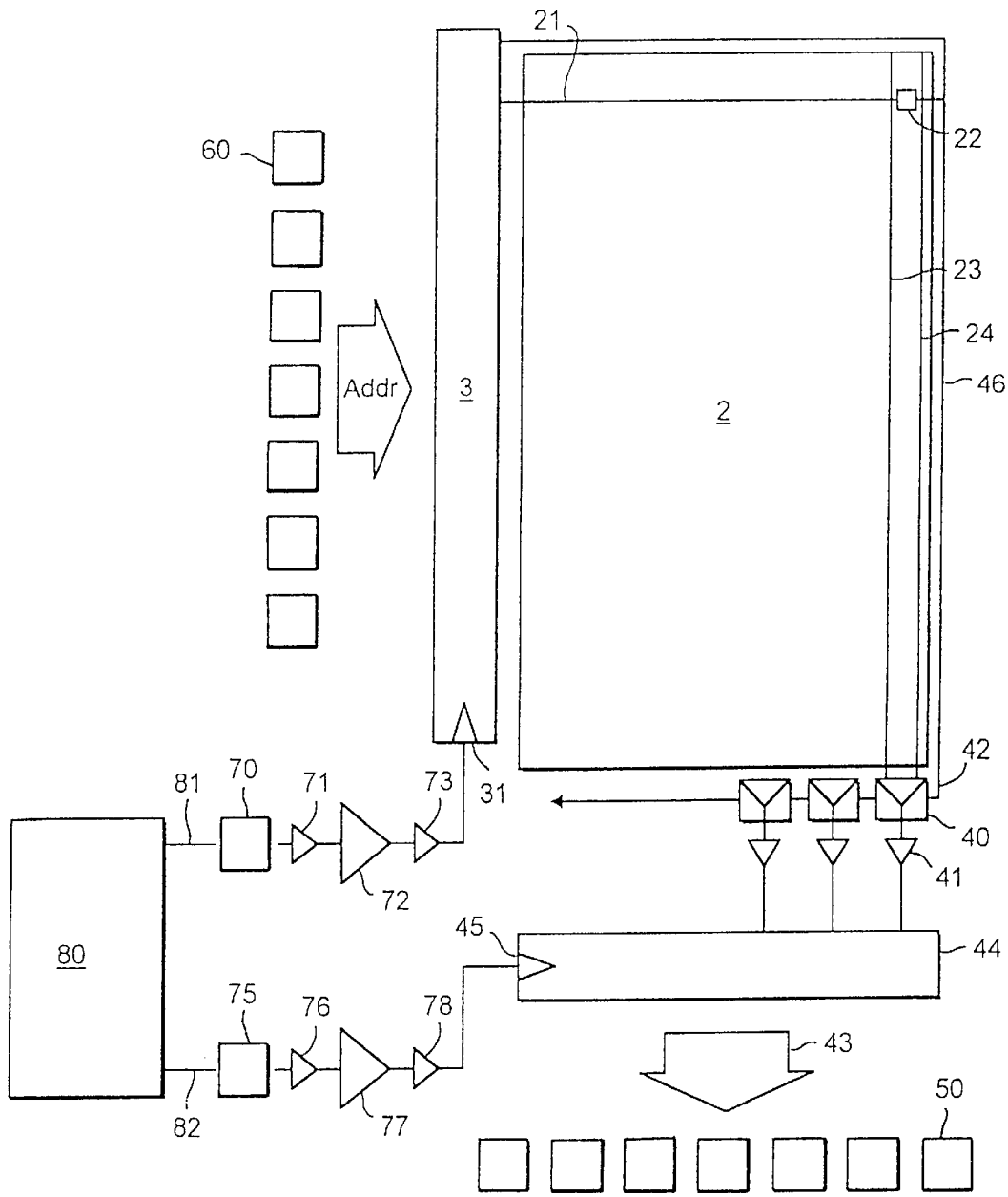
FIG. 4 shows a block schematic diagram of a memory testing device incorporating an embodiment of the present invention.

Referring now to FIG. 4 a device incorporating a first embodiment of the invention has clocked flip-flop circuitry 44 at the outputs from the buffers 41. The flip-flop circuitry 44 has a clock input 45 and is operable at the time of transition of the clock input 45 to store at its outputs the states pertaining at its inputs immediately before the clock pulse transition. The clock input 45 of the flip-flop circuitry 44 is provided with a clocking signal from a pad 75 via a path consisting of the series connection of elements 76, 77 and 78. These elements are so configured that the delay between the flip-flop circuitry clock pad 75 and clock input 45 is as near as possible equal to the delay between the address register clock input pad 70 and the clock input terminal 31 of the address register 3.

The device further comprises a clock generator 80 which has two clock outputs 81, 82 the first clock output 81 being connected to the address register clock input pad 70 of the device and the clock output 82 being connected to the flip-flop circuitry clock pad 75 of the device. The clock circuit 80 is capable of generating the first clock signal 81 at selected intervals, each such generation being followed by generation of the second clock signal 82 at a controllable variable delay afterwards. The variable delay is controllably set to establish the access time of the memory array 2 as will now be described.

Figure 5:
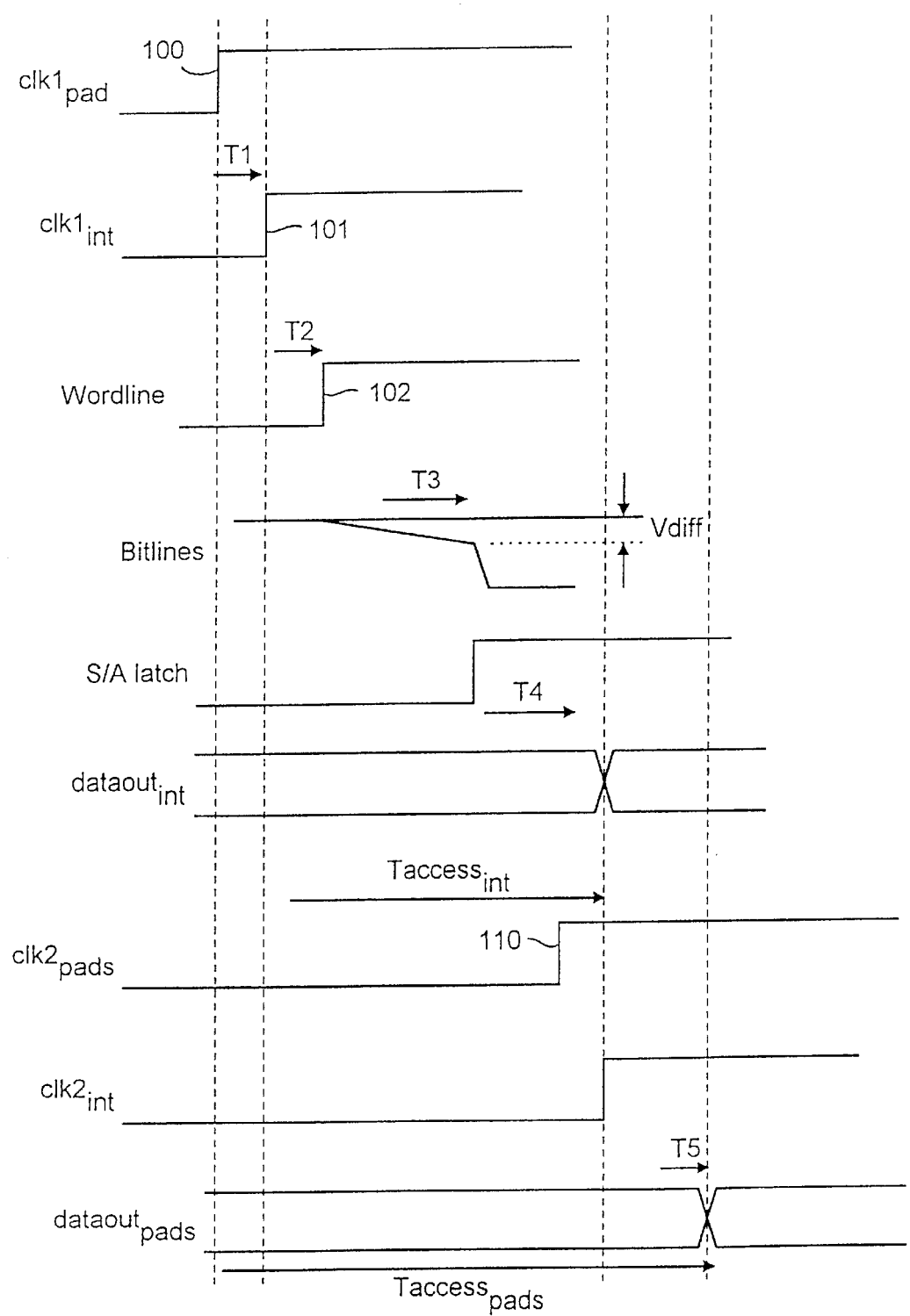
FIG. 5 shows a timing diagram for the device of FIG. 4.

Referring now to FIG. 5 a clock pulse 100 is applied from the first clock signal line 81 to the address register clock input pad 70 and after propagation along the path comprising elements 71, 72, 73 arrives at the clock input 31 of the address register 3 to form an internal clock signal 101 at a time T1. As previously described with respect to FIG. 3, this results in the wordline transition 102 at time T2, differential bitline activation followed by sense amplifier clocking at time T3 and internal data determination at the outputs of buffers 41 at time T4.

Transmission of the state at the output of the buffers 41 to the circuit output pads 50 will only occur if a second clock pulse from the second clock signal line 82 is applied to the flip-flop circuitry clock terminal pad 75 to arrive at the clock terminal 45 of the flip-flop circuitry 44 after the buffers 41 have produced their output. If a clock pulse is applied to the clock input 45 of the flip-flop circuitry 44 at the instant that the buffers 41 produce their output, then the access time of the memory is equal to the period between the application of the internal clock to the address buffer 3 and the application of the second internal clock to the clock node 45. Such a period is not itself directly capable of measurement, but it will be recalled that the time delay of the path from address register clock input pad 70 to the clock input 31 of the address register 3 is, in this embodiment, identical to the delay between flip-flop clock input pad 75 and clock input 45 of the flip-flop circuitry 44. Hence the time spacing between application of the first clock to the clock input pad 70 and application of that second clock 110 to clock input pad 75 which give rise to the second internal clock being coincident with the output from buffers 41, is equal to the memory access time.

It will thus be clear that if the memory is successively accessed with an ever increasing time difference between application of the first and second clocks, then that time spacing which first allows the output conditions to reach the output pads 50 will correspond to the access time of the circuit. Similarly, if the memory is successfully accessed with an ever decreasing time difference between application of the first and second clocks, then that time spacing which last allows the output conditions to reach the output pads 50 will correspond to the access time of the circuit.

Those skilled in the art will be aware that because measurement is made only at the external connection pads of the circuit arrangement, there is no requirement to obtain physical access to internal nodes. Similarly, since it is only the accuracy with which the rising edges of two clock pulses are placed that is important, it is not necessary to use a high performance testing device.

What is claimed is:

1. A device for measuring the response time of a circuit, the circuit having an output for providing a response to a stimulus at an input node thereof, the device comprising first circuitry having a clock node and an output, said first circuitry being connected to store an output condition, said output condition corresponding to a state of said circuit output at the time of occurrence of a clock pulse at said clock node, the device further comprising second circuitry and third circuitry, said second circuitry being responsive to a second circuitry input signal at its input to provide said stimulus at said input node of said circuit, and said third circuitry being responsive to a third circuitry input signal at its input to provide a clock pulse at said clock node whereby said response time is determined by the time between said second circuitry input signal and said third circuitry input signal, wherein said second circuitry has an output connected to said input node, and said third circuitry has an output connected to said clock node, and a delay between the input to said second circuitry and its output is substantially the same as a delay between the input and output of the third circuitry.

2. The device of claim 1 wherein said circuit comprises a memory, having address latch circuitry with a clock input as said circuit input node, an array of memory cells coupled to said address latch circuitry and sense amplifier circuitry connected to said array, said sense amplifier circuitry having a sense amplifier output as said circuit output.

3. The device of claim 2 wherein said memory is an embedded memory.

4. The device of claim 3 wherein said embedded memory comprises a SRAM.

5. The device of any one of the preceding claim wherein the first circuitry comprises flip-flop circuitry.

6. A device for measuring a response time of a circuit between an input node and a circuit output thereof, wherein said circuit output is connected via first connecting circuitry to an output pad, said device comprising a first timing signal source for providing a first timing signal to said input node via a first path having a first delay, clocked circuitry having a clock node and being connected at said circuit output, said clocked circuitry having an output to said first connecting circuitry, said clocked circuitry being responsive to a clock signal at said clock node to provide to said first connecting circuitry a signal existing at said circuit output immediately prior to the occurrence of said clock signal, the device further comprising a second timing signal source for providing a second timing signal as said clock signal to said clock node via a second path having a second delay substantially equal to said first delay, and means for determining a time period between said first and second timing signals.

7. The device of claim 6 wherein said clock circuitry comprises a flip-flop.

8. The device of claim 6 and further comprising a sensing device connected to said output pad for sensing a desired output thereat.

9. The device of claim 6 wherein said circuit comprises a static RAM.

10. The device of claim 9 wherein said static RAM comprises address latch circuitry having a latch clock node as said input node, an array of memory cells coupled to said address latch circuitry, and sense amplifier circuitry having a sense amplifier output node as said output node.

11. A method of measuring the response time of a circuit having a circuit output for providing an output in response to a stimulus applied to a circuit input, the circuit input being connected to a first input pad via first circuitry having a predetermined delay, the method comprising: providing second circuitry having a clock node, said clock node being connected to a second input pad via third circuitry, said third circuitry having said predetermined delay, and said second circuitry having an output for storing an output condition, said output condition corresponding to the state of said circuit output at the time of occurrence of a clock pulse at said clock node; repeatedly applying a stimulus to said first input pad and at a variable delay after each application, providing a clock pulse to said second input pad; and determining, as said response time, a value of said variable delay corresponding to a desired output condition of said second circuitry.

12. A method of claim 11 wherein said second circuitry is coupled to an output pad, and said determining step comprises monitoring said output pad.

13. The method of claim 11 wherein said desired output condition is a valid condition such that reduction of said variable delay produces an invalid condition.

14. The method of claim 12 wherein said desired output condition is a valid condition such that reduction of said variable delay produces an invalid condition.

* * * * *